US010312053B2

(12) United States Patent
Ishizawa et al.

(10) Patent No.: US 10,312,053 B2
(45) Date of Patent: Jun. 4, 2019

(54) CHARGED PARTICLE BEAM APPARATUS, ALIGNMENT METHOD OF CHARGED PARTICLE BEAM APPARATUS, ALIGNMENT PROGRAM, AND STORAGE MEDIUM

(71) Applicant: Hitachi High-Technologies Corporation, Minato-ku, Tokyo (JP)

(72) Inventors: Kazuki Ishizawa, Tokyo (JP); Hiroyuki Chiba, Tokyo (JP); Yoshihiro Takahoko, Tokyo (JP); Daichi Nara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/556,400

(22) PCT Filed: Mar. 31, 2015

(86) PCT No.: PCT/JP2015/060098
§ 371 (c)(1),
(2) Date: Sep. 7, 2017

(87) PCT Pub. No.: WO2016/157403
PCT Pub. Date: Oct. 6, 2016

(65) Prior Publication Data
US 2018/0108512 A1   Apr. 19, 2018

(51) Int. Cl.
*H01J 37/28* (2006.01)
*H01J 37/22* (2006.01)
(Continued)

(52) U.S. Cl.
CPC .......... *H01J 37/28* (2013.01); *H01J 37/1471* (2013.01); *H01J 37/20* (2013.01); *H01J 37/22* (2013.01);
(Continued)

(58) Field of Classification Search
CPC .. H01J 37/00; H01J 37/02; H01J 37/22; H01J 37/222; H01J 37/24; H01J 37/244; H01J 37/26; H01J 37/261
(Continued)

(56) References Cited

U.S. PATENT DOCUMENTS

2016/0163504 A1\* 6/2016 Takeda .................... H01J 7/244
250/307

FOREIGN PATENT DOCUMENTS

JP    11-297794 A    10/1999
JP    2010-198998 A   9/2010

OTHER PUBLICATIONS

International Search Report (PCT/ISA/210) issued in PCT Application No. PCT/JP2015/060098 dated Apr. 28, 2015 with English translation (four pages).
(Continued)

*Primary Examiner* — Jason L McCormack
(74) *Attorney, Agent, or Firm* — Crowell & Moring LLP

(57) ABSTRACT

The present invention shortens the time spent in a search for a visual field by a user in a charged particle beam apparatus in which an observation range on a sample is set by using a captured image of the sample. When the contour of a sample table is circularly configured, for example, the central position of a sample table image on an optical image is quickly, easily, and accurately obtained by calculating, from the coordinates of the respective vertices of a triangle circumscribed about the contour created on the optical image by the user, the incenter of the triangle without direct recognition by automatic image analysis, which is complex and time-consuming, of the contour of the sample table image on the optical image.

14 Claims, 12 Drawing Sheets

(51) Int. Cl.
  *H01J 37/24* (2006.01)
  *H01J 37/147* (2006.01)
  *H01J 37/20* (2006.01)
(52) U.S. Cl.
  CPC ....... *H01J 37/24* (2013.01); *H01J 2237/1501* (2013.01); *H01J 2237/20292* (2013.01); *H01J 2237/2814* (2013.01); *H01J 2237/2816* (2013.01); *H01J 2237/2826* (2013.01)
(58) Field of Classification Search
  USPC .......................................... 250/306, 307, 311
  See application file for complete search history.

(56) References Cited

OTHER PUBLICATIONS

Japanese-language Written Opinion (PCT/ISA/237) issued in PCT Application No. PCT/JP2015/060098 dated Apr. 28, 2015 (three pages).

\* cited by examiner

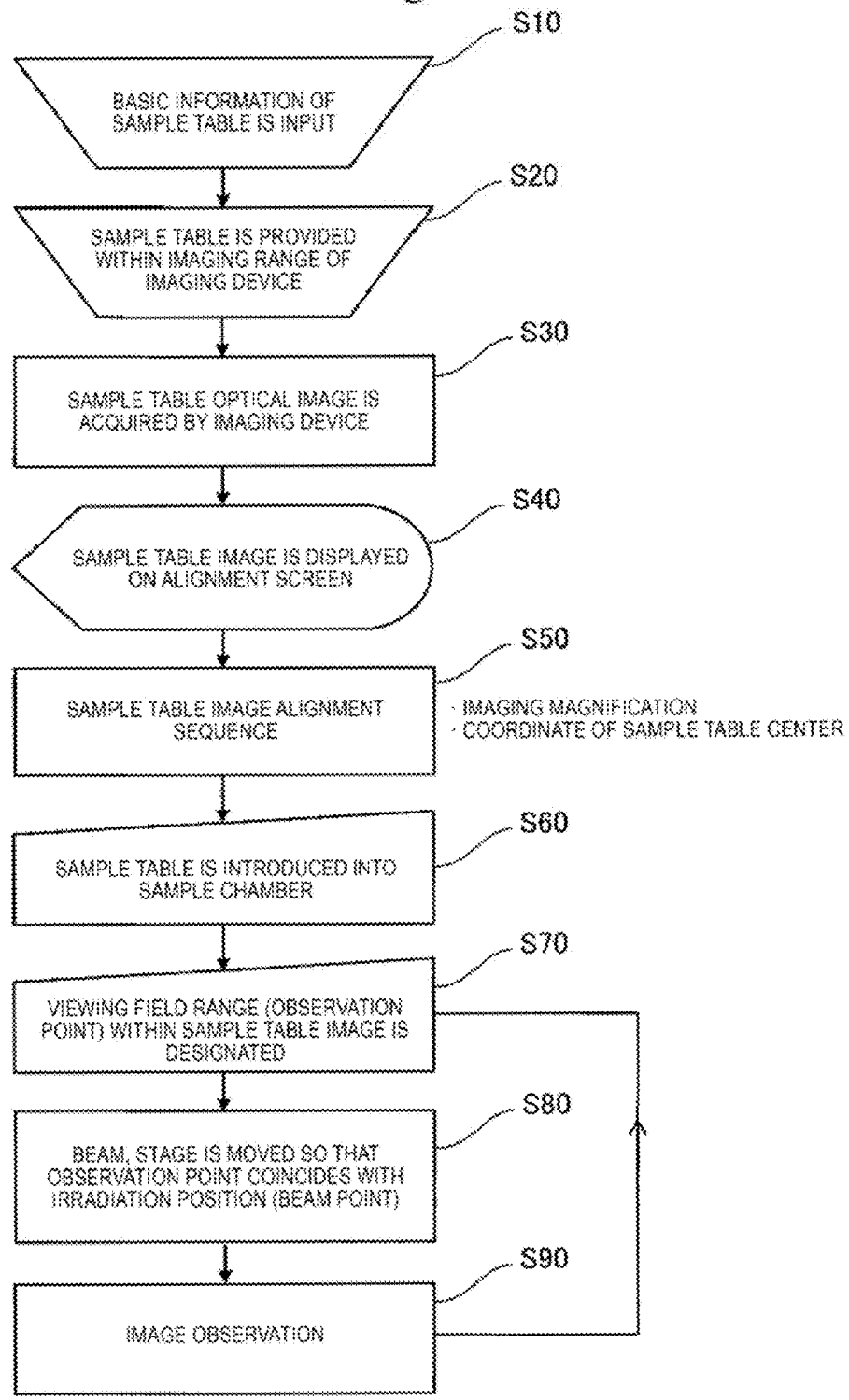

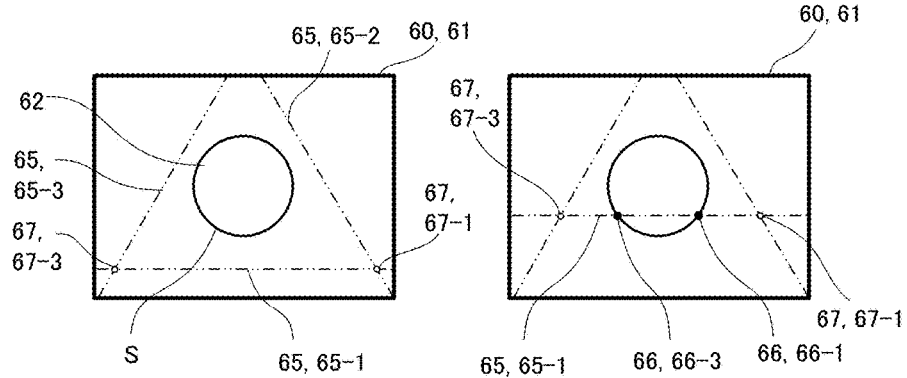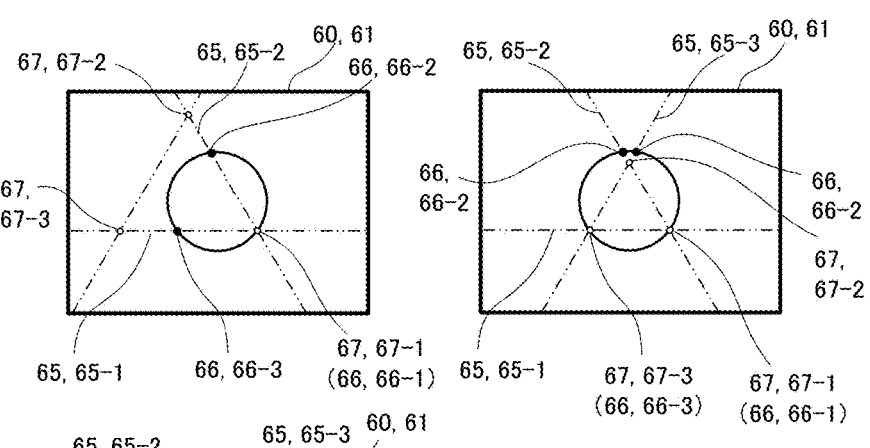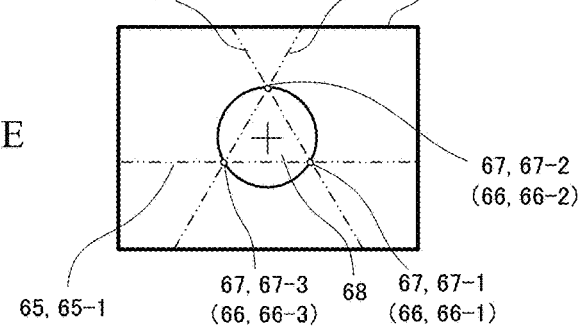

CHARGED PARTICLE BEAM APPARATUS, ALIGNMENT METHOD OF CHARGED PARTICLE BEAM APPARATUS, ALIGNMENT PROGRAM, AND STORAGE MEDIUM

TECHNICAL FIELD

The present invention relates to a charged particle beam apparatus such as a scanning electron microscope, and more particularly, to searching of viewing field.

BACKGROUND ART

Normally, searching of viewing field in charged particle beam apparatus including an imaging device is performed by acquiring a captured image of a sample placed on an sample table by an imaging device and selecting a position or a range on the sample to be observed by being irradiated with an electron beam by the charged particle beam apparatus as a viewing field range within an acquired captured image of the sample table and the sample. In the charged particle beam apparatus, an observation range on the sample irradiated with a charged particle beam is set from data of the captured image relating to the selected viewing field range, and an observation image relating to the viewing field range of the sample is obtained by irradiating the observation range with the charged particle beam.

In the searching of viewing field, the acquisition of the captured image of the sample table and the sample by the imaging device is performed by appropriately enlarging/reducing the sample table on which the sample is placed to image the sample table. The selection of the viewing field range is performed by specifying a desired position and range on the captured image displayed by a display device. Therefore, in a case where the imaging device or the captured image of which an enlargement magnification is unknown is used for selection of the viewing field range, in order to acquire the observation range on the sample irradiated with the charged particle beam from the selected viewing field range, it is necessary to specify an imaging magnification of the captured image acquired by being appropriately enlarged/reduced.

Therefore, in order to specify the imaging magnification of the captured image of the sample table and the sample acquired by the imaging device, in a scanning electron microscope disclosed in Patent PTL 1, an adjustment guide for sample table recognition having the same shape as that of the sample table in an optical image, is displayed on a display screen on which an optical image of the sample table and the sample of the display device imaged by an optical imaging device is displayed to identify a size of the sample table in the optical image, and the adjustment guide is enlarged reduced/moved on the display screen to make it coincide with the optical image of the sample table on the display screen, thereby recognizing the size and a center position of the sample table on the optical image. The enlargement magnification of the optical image acquired by the optical imaging device and the center position of the sample table on the optical image are calculated based on a correspondence between the size of the recognized optical image of the sample table on the display screen and an actual size of the sample table stored in advance, and are used in alignment when being observed by the charged particle beam apparatus.

CITATION LIST

Patent Literature

PTL 1: JP-A-2010-198998

SUMMARY OF INVENTION

Technical Problem

In Patent PTL 1, in order to recognize the size and the center position of the sample table on the optical image, the adjustment guide for recognition of the sample table is enlarged/reduced/moved on the display screen of the optical image in the display device and it is necessary to adjust two parameters of a diameter (size of the adjustment guide) and the center position of the adjustment guide to make the adjustment guide coincide with the sample table on the optical image.

However, in order to accurately recognize the size and the center position of the sample table on the optical image acquired by the optical imaging device, there is a problem that it is necessary to repeat mutual adjustment of two parameters of a size and a center position of a recognition guide one by one on the display screen of the optical image in the display device. For example, if the size of the sample table is adjusted, the center position is shifted. On the contrary, if the center position is adjusted, the size of the sample table is shifted. Therefore, it is necessary to adjust two parameters one by one mutually and repeatedly.

In addition, confirmation whether or not the adjustment guide for recognition of the sample table after the adjustment coincides with the sample table of the optical image on the display screen is also performed by visual confirmation of a user regarding whether or not contours of both are displayed by being overlapped in all ranges. In the overlapped displayed of all the ranges, one contour is hidden by the other contour so that accurate confirmation requires skill and there is also a problem that a confirmation accuracy error of coincidence is likely to occur.

An object of the invention is to eliminate repetitive work when recognizing a size and a center position of a sample table, reduce man-hour for a user operation, and perform specification of an enlargement magnification of an imaging device and recognition of a center position of the sample table quickly and easily with higher accuracy.

Solution to Problem

The present invention relates to, for example, a charged particle beam apparatus including an image display portion that displays a captured image including a sample table image of the acquired sample table by a imaging device; an operation input portion that sets and inputs a measurement reference point by designating points positioned apart from each other on a contour of the sample table image on a captured image displayed on the image display portion; sample table image size calculation portion that calculates a size of the sample table image on the captured image based on a distance on the captured image between a plurality of measurement reference points which are set and input by an operation of the operation input portion; and an imaging magnification calculation portion that calculates an imaging magnification of the captured image from a size of the sample table image calculated by the sample table image size calculation portion and an actual size of the sample table.

In addition, the present invention relates to, for example, an alignment method of a charged particle beam apparatus, the method including a sample table image display step of displaying a captured image including a sample table image of a sample table on which a sample is placed which is acquired by a imaging device on an image display portion; an operation setting step of setting and inputting a measurement reference point by designating points that are positioned apart from each other on a contour of the sample table image based on an operation of an operation input portion on the captured image displayed on the image display portion by the sample table image display step; a sample table image size calculating step of calculating a size of the sample table image on the captured image based on a distance on the captured image between a plurality of measurement reference points which are set and input bye the operation setting step; and an imaging magnification calculating step of calculating an imaging magnification of the captured image from a size of the sample table image calculated by the sample table image, size calculating step and an actual size of the sample table.

Advantageous Effects of Invention

According to the invention, in the charged particle beam apparatus which sets the observation range on the sample using the captured image of the sample, it is possible to perform the specification of the enlargement magnification or the recognition, of the center position of the sample table quickly and easily with higher accuracy when imaging the captured image of the sample by the imaging device. Therefore, it is possible to reduce a time spent in searching of viewing field of a user.

Moreover, objects, configurations, and effects other than the above are clarified from the description of the following embodiments.

BRIEF DESCRIPTION OF DRAWINGS

FIG. 2 is a flowchart illustrating a flow from a sample table image alignment to sample observation by being irradiated with an electron beam in the scanning electron microscope illustrated in FIG. 1.

FIG. 3 is an explanatory view

FIGS. 4A-4E are explanatory views of a sample table image alignment sequence according to a second example.

DESCRIPTION OF EMBODIMENTS

Hereinafter, charged particle beam apparatus of the embodiments of the invention will be described with reference to the drawings.

In the description, as the charged particle beam apparatus, the scanning electron microscope is described as an example, but the charged particle beam apparatus of the invention is not limited to the scanning electron microscope. The charged particle beam apparatus according to the invention sets an observation range on the sample acquiring an observation image by the charged particle beam apparatus on a captured image of the sample acquired by an imaging device and may use an imaging magnification of the captured image used in setting of a viewing field range by the imaging device in the alignment of an irradiation position of a charged particle beam when acquiring the observation image of the sample by irradiating the observation range on the sample corresponding to the viewing field with the charged particle beam. The charged particle beam apparatus also includes, for example, a scanning ion microscope, a scanning transmission electron microscope, a combined apparatus of these apparatuses with a sample processing apparatus, an analysis and inspection apparatus applying these apparatuses, or the like.

Figure 1:
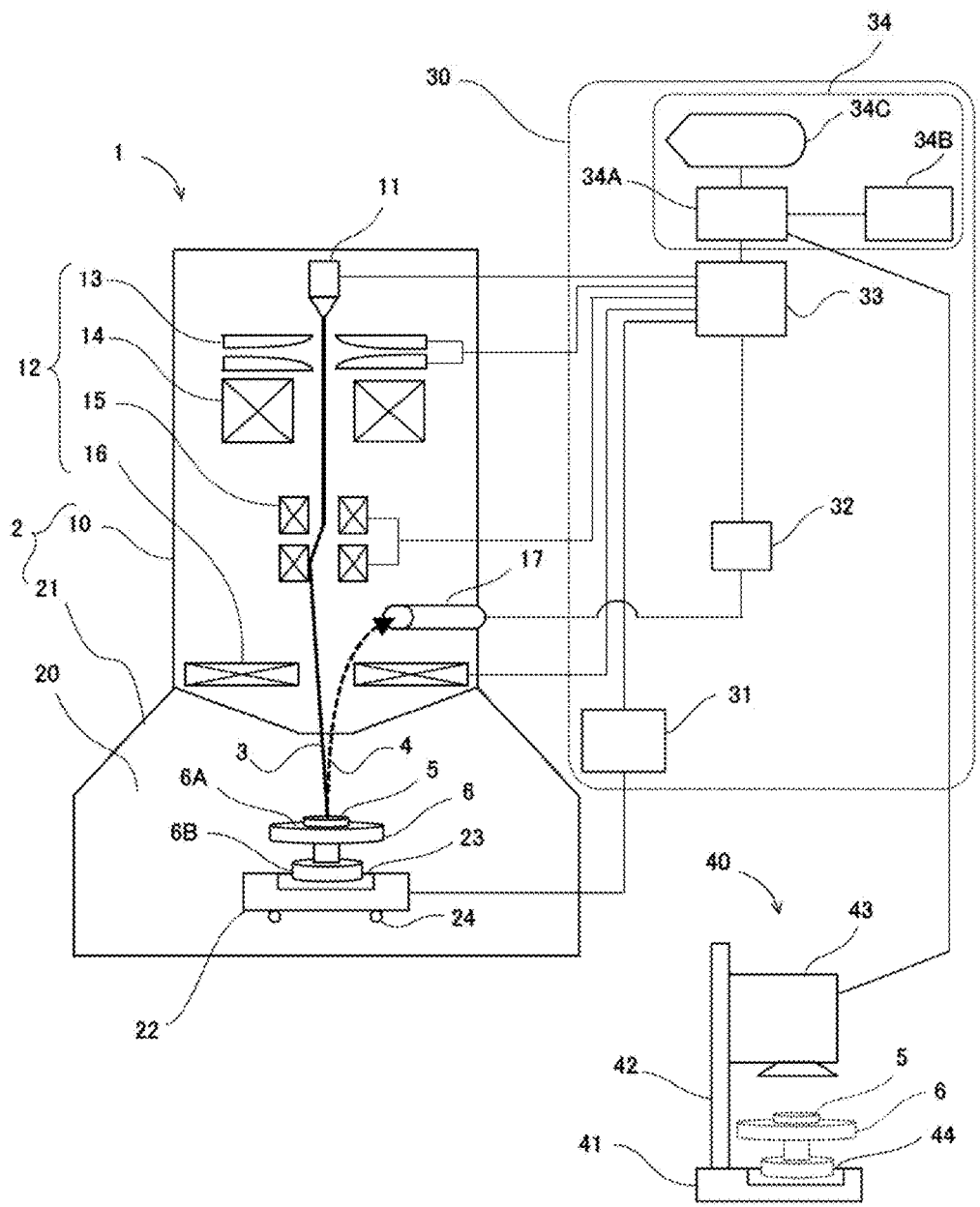
FIG. 1 is a schematic configuration view of an example of a scanning electron microscope as a charged particle beam apparatus according to an embodiment of the invention.

FIG. 1 is a schematic configuration view of an example of the scanning electron microscope as the charged particle beam apparatus according to an embodiment of the invention.

A scanning electron microscope 1 has a lens barrel 10, a microscope device body 2 that is integrated with a sample chamber housing 21 forming a sample chamber 20, a vacuum evacuation unit (not illustrated) that evacuates an inside of the lens barrel 10 and an inside of the sample chamber 20, and a control device 30 that controls each portion of the microscope device.

The lens barrel 10 is provided with an electron gun. 11 configuring a charged particle source emitting an electron beam 3 as a charged particle beam, and an, electron optical system as the charged particle optical system that controls irradiation of the electron beam 3. When irradiating with the electron beam 3, the inside of the lens barrel 10 is maintained in a vacuum state by the vacuum evacuation unit.

The electron optical system 12 includes an anode 13 that accelerates the electron beam 3 emitted from the electron gun 11, a condenser lens 14 that focuses the electron beam 3, a deflector 15 that scans the electron beam 3, and an objective lens 16 that adjusts a focus of the electron beam 3 along an optical axis direction of the electron optical system 12. In the illustrated example, a detector 17 that detects signal particles (for example, secondary electrons, reflected electrons, the like) 4 generated from a sample 5 by irradiation with the electron beam 3 is also provided in the lens barrel 10.

The sample chamber 20 is configured such that a sample table 6 on which the sample 5 is placed is accommodated via an inlet/outlet port (not illustrated) which is able to be opened and closed provided in the sample chamber housing 21. The sample chamber 20 is provided with a stage 22 on which the sample table 6 is held. In the sample chamber 20, when the sample is observed, an atmosphere in the chamber is evacuated by the vacuum evacuation unit and the sample chamber 20 is kept in the vacuum state.

The stage 22 includes a mounted portion 23 on which the sample table 6 is detachably mounted, and a moving mechanism 24 that displaces a position or a direction of the sample 5 within the sample chamber 20 by moving, rotating, or inclining the mounted portion 23, for example, in a horizontal plane and in a height direction within the sample chamber 20 together with, the sample table 6. The stage 22 holds the sample table 6 within the sample chamber 20 and displaces the sample 5 placed on the sample table 6 together with the sample table 6, thereby changing an irradiation position and/or an irradiation direction of the electron beam 3 from the electron optical system 12 to the sample 5.

The sample table 6 is provided with a placement surface GA on which the sample 5 is placed, and a mounting portion 65 with respect to the mounted portions 23 and 44 which are respectively provided in the stage 22 and a mounting table 41 of an imaging device 40 which is described below. The sample table 6 is configured in advance such that a shape (hereinafter, generally referred to as a contour S of the sample table 6), in which the placement surface 6A and/or the sample table 6 itself is viewed along an axial direction of the sample table 6 itself, which is perpendicular to the placement surface 6A, through a center and/or a center of gravity of the placement surface 6A, has a predetermined shape. In the illustrated example, the sample table 6 has the contour S formed in a circular shape. Moreover, the contour S of the sample table 6 is not limited to the circular shape and, for example, the center of gravity and the center of the contour S coincide with each other, and a sample table image alignment which is described below is easily performed by configuring the contour S in advance in a figure such as a rectangle, a parallelogram, and a regular polygon, in addition to the circular shape.

In the microscope device body 2 configured as described above, the electron beam 3 emitted from the electron gun 11 is controlled/accelerated by the anode 13, is focused by the condenser lens 14 and the objective lens 16, and the sample 5 on the sample table 6 mounted on the stage 22 within the sample chamber 20 is irradiated with the electron beam 3 from the lens barrel 10. Furthermore, the electron beam 3 from the lens barrel 10 is deflected by the deflector 15 and a scanning range, a scanning direction, and a scanning speed of the electron beam 3 with which the sample 5 is irradiated are adjusted. The signal particles 4 generated from the sample 5 by the irradiation of the electron beam 3 is detected by the detector 17.

On the other hand, the control device 30 controls each portion of the apparatus including a stage control portion 31, a signal processing portion 32, an apparatus control portion 33, and a computer portion 34.

The stage control portion. 31 performs a drive control of the moving mechanism 24 of the stage 22 in accordance with an instruction supplied from the apparatus control portion 33 concerning the movement, the rotation, and the inclination of the mounted portion 23 on which the sample table 6 is mounted. The signal processing portion 32 amplifies and A/D converts a detection signal from the detector 17, stores an image memory in association with an irradiation position of the electron beam 3 controlled by the apparatus control portion 33, and generates image data of an irradiation range of the electron beam 3.

The apparatus control portion 33 controls the electron gun 11 and the electron optical system 12 according to alignment information based on the sample table image alignment (described later) from the computer portion 34 or an observation condition of the sample 5 including the viewing field range. Therefore, the apparatus control portion 33 performs the control of the electron beam with which the sample 5 is irradiated, the control of the stage 22 on which the sample table 6 on which the sample 5 is placed is mounted via the stage control portion 31, and the control of the position and the direction of the sample 5 within the sample chamber 20. In addition, the apparatus control portion 33 transmits the image data generated by the signal processing portion 32 to the computer portion 34 based on a transmission instruction from the computer portion 34.

The computer portion 34 performs the control of each portion of the apparatus including the electron gun 11, the electron optical system 12, and the stage 22 via the apparatus control portion 33, and performs the control of the entire apparatus regarding an observation process of the sample 5 or the alignment including the sample table image alignment. The computer portion 34 includes a computer body 34A including a CPU, a memory, an interface, and the like, an operation input device 343 such as a mouse, a keyboard, and an operation panel, and a display device (display) 34C for displaying various On Screen Display (OSD) screens for setting the observation conditions of the sample 5 including the viewing field range or the like, and the alignment, and the observation image of the sample 5 generated by the computer body 34A based on the image data acquired from the apparatus control portion 33. In addition, the computer portion 34 is also communicatively connected to the imaging device 40 and acquires a captured image imaged by the imaging device 40 directly from the imaging device 40.

In the embodiment, the imaging device 40 is configured to be provided outside the sample chamber 20 of the scanning electron microscope 1 separately from the microscope device body 2 of the scanning electron microscope 1. The imaging device 40 images the captured images of the sample table 6 and the sample 5 which are used for in setting of the viewing field range or the alignment in the scanning electron microscope 1.

In the illustrated example, the imaging device 40 is configured such that a COD camera 43 is supported on a stand 42 erected from the mounting table 41, which is apart from the mounting table 41 and of which an imaging direction faces the mounting table 41 side. The mounting table 41 is provided with a mounted portion 44 on which the mounting portion GB of the sample table 6 detachably mounted in a state where the placement surface 6A of the sample table 6 faces in a direction along the imaging direction.

The mounting table 41 of the imaging device 40 is configured such that the mounted portion 44 is formed in a manner that an axial direction of the sample table 6 is able to coincide with the optical axis direction of the CCD camera 43 when the mounting portion 6B of the sample table 6 is installed. In the illustrated example, the mounted portion 44 of the mounting table 41 has the same shape as that of the mounted portion 23 of the stage 22. Therefore, in a case of the illustrated imaging device 40, the mounted portion 44 can be exchanged with respect to the mounting table 41 and, for example, the same imaging device 40 can also be used for searching of viewing field of another scanning electron microscope irrespective of differences in size, shape, or the like of the sample table 6 due to differences in models of the scanning electron microscope 1. Moreover, even through the mounted portion 44 of the mounting table 41 is exclusive to predetermined scanning electron microscope 1 and sample table 6, it may include a mechanism which is able to adjust to be mounted depending on the difference of the scanning electron microscope 1 and the sample table 6.

The CCD camera 101 of the imaging device 40 is configured such that an imaging magnification thereof is able to be arbitrary adjusted so as to correspond to the difference in size of the sample 5 placed on the placement surface 6A of the sample table 6 or size of the sample table 6 itself. Therefore, a user can image the optical image of the sample table 6 on which the sample 5 is placed by enlarging/reducing the optical image at an appropriate imaging magnification.

The optical image of the sample table 6 or the optical image of the sample table 6 on which the sample 5 is placed which are imaged by the imaging device 40 is able to be acquired from the imaging device 40 directly by the computer portion 34 of the scanning electron microscope 1 communicatively connected to the imaging device 40. The computer portion 34 displays the acquired optical images of the sample table 6 and the sample 5 on the display device 34C as a Graphical User Interface (GUI) on the OSD screen when setting the sample table image alignment or the viewing field range (described later) in the searching of viewing field of the scanning electron microscope 1.

Moreover, in the embodiment, the COD camera 43 is used as the imaging mechanism of the imaging device 40, but the imaging mechanism may be a CMOS image sensor or an imaging mechanism other than the optical imaging mechanism. In addition, although the computer portion 34 and the imaging device 40 of the scanning electron microscope 1 are communicatively connected, both are disconnected from each other and, for example, the user may read and store the captured image imaged by the imaging device 40 in the computer portion 34 via a storage medium.

Next, a flow from the sample table image alignment for recognizing the size and the center position of the sample table on the optical image to the sample observation by irradiating the sample 5 with the electron beam 3 based on the optical image of the sample table 6 acquired from the imaging device 40 by the computer portion 34 of the scanning electron microscope 1 or the optical image of the same sample table 6 on which the sample 5 is placed will be described with reference to FIG. 2.

FIG. 2 is a flowchart illustrating the flow from a sample table image alignment to sample observation by being irradiated with an electron beam in the scanning electron microscope.

Step S10; When observing the sample 5 with the scanning electron microscope 1, the user inputs information of an actual sample table size, and a shape of the sample table 6, or the like used for the observation of the sample 5 as basic information. The input is performed based on a predetermined operation of the operation input device 34E in the computer port ion 34 of the scanning electron microscope 1.

Step S20; The user installs the sample table 6 used for the observation of the sample 5 in the mounting table 41 of the imaging device 40. Here, a description will be given on the assumption that the sample table 6 on which the sample 5 is placed to be observed by the scanning electron microscope for the acquisition of the optical image of the sample table 6 is used for the sample table image alignment so that the acquisition of the optical image of the sample table 6 used for the sample table image alignment and the acquisition of the optical image of the sample 5 used for setting the viewing field range when observing the sample are able to complete by mounting the sample table 6 on the mounting table 41 once.

The installation is performed by mounting the mounting portion 6B of the sample table 6 on the mounted portion 44 of the mounting table 41 included in the imaging device 40. In this case, on the mounting table 41 of the imaging device 40, the mounted portion 44 having the same shape as that of the mounted portion 23 of the stage 22 is prepared in advance on the mounting table 41. Therefore, the sample table 6 is held at a determined imaging position of the imaging device 40 in a manner that the placement surface 6A of the sample table 6 and the sample 5 provided on the mounting table 41 face the CCD camera 43, and the axial direction of the sample table 6 itself coincides with the optical axis direction of the CCD camera 43. Moreover, the mounting of the sample table 6 can also be automatically performed by using, for example, a material handling device or the like.

Step S30; The user images the optical image including the sample table image of the entirety of the sample table 6 using the imaging device 40.

In a case where an observation range on the sample for acquiring the observation image by the charged particle beam apparatus is set as the viewing field range on the optical image of the sample 5 acquired by the imaging device 40, normally, the user images the sample table 6 by enlarging/reducing the sample table 6 to an appropriate imaging magnification according to the size of the sample 5 placed on the sample table 6 or the like so as to be easily used for the setting of the viewing field range. In step S30, in this case, since the size or the center position of the sample 5 on the optical image used for the setting of the viewing field range is unknown, the user images the sample 5 with an appropriate imaging magnification so that the entirety of the sample table 6 is accommodated in the optical image imaged by the imaging device 40. Moreover, the optical image in which the entirety of the imaged sample table 6 is accommodated and the optical image of the sample 5 for setting the viewing field range may be the same or different from each other. Hereinafter, the optical image in which the entirety of the sample table 6 is accommodated is referred to as an optical image 61 including the sample table image and the entirety of the sample table portion in the optical image is referred to as the sample table image 62 for convenience (see FIG. 3).

Step S40; In the computer portion 34 of the scanning electron microscope 1, the computer body 34A acquires the optical image 61 including the sample table image 62 from the imaging device 40. The computer body 34A displays a sample table image alignment screen that is the OSD screen of the sample table image alignment on the display device 34C and acquires the optical image 62 including the sample table image 62 from the imaging device 40 as a Graphical User Interface (GUI) on the alignment screen.

Step S50; In the computer portion 34 of the scanning electron microscope 1, the computer body 34A performs a sample table image alignment sequence (described later), recognizes the size and center coordinates of the sample table image 62 in the optical image 61 including the sample table image 62 acquired from the imaging device 40, and collates the size and the center coordinates with known basic information of the sample table 6 given in step 310 to calculate the imaging magnification of the acquired optical image 61 including the sample table image 62.

Here, respective original point coordinates (for example, respective viewing field center positions) of the scanning electron microscope 1 and the imaging device 40 are disposed on arbitrary stage coordinates related to the movement of the mounted portion 23 of the stage 22 or the like, and it is possible to align the center coordinates of each other if the center of the optical image 61 imaged by the imaging device 40 is displayed so as to be the center of the display device 34C on which the observation image acquired by the scanning electron microscope 1 is displayed.

That is, in a case where the viewing field range on the sample 5 for acquiring the observation image by the scanning electron microscope 1 is set on the optical image 61 including the sample table image 62 acquired by the imaging device 40, it is important that the center of the sample table 6 on the optical image 61 of the sample 5 for setting the viewing field range is positioned at the same position as the center of the sample table 6 when being accommodated and disposed within the sample chamber 20. In the scanning electron microscope 1, normally, the stage 22 moves the sample 5 together with the sample table 6 with reference to the mounted portion 43, that is, the center of the sample table 6 mounted on the mounted portion 23 within the sample chamber 20. For example, the center of the sample table 6 mounted on the mounted portion 44 of the mounting table 41 coincided with the optical axis of the CCD camera 43 in the imaging device 40 matches with the center of the same sample table 6 mounted on the mounted portion 23 in the scanning electron microscope 1 so that the alignment of the scanning electron microscope 1 is easily performed. However, the respective centers of the observation image and the optical image are slightly shifted between the scanning electron microscope 1 acquiring the observation image of the sample 5 and the imaging device 40 acquiring the optical, image of the sample 5 for setting the viewing field range. Therefore, the size and the center coordinates of the sample table image 62 in the optical image 61 including the sample table image 62 is recognized and the imaging magnification of the optical image 61 including the sample table image 62 is calculated so that the alignment between the optical image 61 for setting the viewing field range acquired from the imaging device 40 and the scanning electron microscope 1 acquiring the observation image thereof is performed.

Step S60; The user mounts the mounting portion 65 of the sample table 6 on the mounted portion 23 of the stage 22 and introduces the sample table 6 at an electron microscope observation position within the sample chamber 20. Moreover, the introduction of the sample table 6 at the electron microscope observation position within the sample chamber 20 can also be automatically performed.

Step S70; In order to set an arbitrary observation point or the observation range acquiring the observation image on the sample 5 by being irradiated with the electron beam 3 as the viewing field range, the user displays the OSD screen for the sample observation including the optical image 61 of the sample 5 as the GUI by the imaging device 40 on the display device 34C of the computer portion 34. Then, the user designates the observation point for acquiring the observation image or the observation image on the optical image 61 of the sample 5 included in the sample observation screen as the GUI by being irradiated with the electron beam 3 and sets the viewing field range using the scanning electron microscope 1. The designation and the setting are performed by the computer body 34A of the computer portion 34 based on an operation input from the operation input device 34B.

Step S80; In the computer portion. 34 of the scanning electron microscope 1, the computer body 34A generates control information of each portion of the apparatus instructing the apparatus control portion 33 for acquiring the observation image of the viewing field range set in step 70 based on the size and the center coordinates of the sample table image 62, and the imaging magnification of the sample table image 62 on the optical image of the sample 5 identified as the sample table image alignment of step S50 and included in the sample observation screen as the GUI. The apparatus control portion 33 controls the movement of the mounted portion 23 of the stage 17 by the moving mechanism 24 based on the control information of each portion of the apparatus, or controls the optical axis of the electron beam 3 so as to cause the viewing field range on the sample 5 that is set and input in step S70 to coincide with the observation range on the sample 5 actually irradiated with the electron beam 3, and to irradiate the viewing field range on the sample 5 with the electron beam 3.

Step S90; In the computer portion 34 of the scanning electron microscope 1, the computer body 34A creates the observation image of the sample 5 in which the viewing field range on the sample 5 that is set and input in step S70 is the observation range, and displays the observation image on the observation screen of the display device 34C based on the image data transmitted via the apparatus control portion 33 and generated by the signal processing portion 32.

Next, a sequence of the sample table image alignment described in step S50 using the optical image 61 including the sample table image 62 displayed on the sample table image alignment screen, as the GUI in step S40 and the optical image 61 including the sample table image 62 will be described based on examples. In the sample table image alignment, the size and the center coordinates of the sample table image 62 on the optical image 61 are recognized and the imaging magnification of the appropriate size is calculated from the optical image 61 including the sample table image 62 imaged by the imaging device 40 with the imaging magnification having an appropriate size required to coincide the center of the sample table 6 when being accommodated and disposed within the sample chamber 20 with the center of the sample table 6 on the optical image of the sample 5 for setting the viewing field range.

First Example

FIG. 3 is an explanatory view of a sample table image alignment sequence according to the first example.

The example schematically illustrates an alignment sequence for recognizing the size and the center coordinates of the sample table image 62 and calculating the imaging magnification of the optical image 61 on the optical image including the sample table image 62 of the sample table 6 of which the contour S is formed in a circle.

As described in step S40 of FIG. 2, the optical image 61 including the sample table image 62 acquired from the imaging device 40 as the GUI is displayed in a predetermined screen portion on the sample table image alignment screen displayed in the display device 340 so that the sample table image 62 portion appears. Moreover, the display of the sample table image 62 portion may be a display of a portion including the sample table image 62 in the optical image 61 in a case where the optical image 61 including the sample table image 62 acquired from the imaging device 40 is enlarged/reduced to a known display magnification. Hereinafter, for the sake of convenience of explanation, an explanation is given in which the display magnification is the same magnification, the entirety of the optical image 61 including the sample table image 62 is displayed on a GUI screen 60 formed of a predetermined screen portion, and the GUI screen 60 corresponds to the entirety of the optical image 61.

In addition, in the illustrated example, on the GUI screen 60, three known linear guide lines 65 (65-1, 65-2, and 65-3), which are different in inclination viewed on the coordinates of the optical image 61, that is, on pixel coordinates of the CCD camera 43 of the imaging device 40, are overlapped and displayed as illustrated in FIG. 3(*a*). Therefore, if the three linear guide lines 65-1, 65-2, and 65-3 are moved appropriately in parallel on the GUI screen 60, a plurality of similar shaped triangles 68 of which vertices are the intersection points 67 (67-1, 67-2, and 67-3) between two linear guide lines of different combinations can be formed on the GUI screen 60, that is, the optical image 61. Each of the three linear guide lines 65-1, 65-2, and 65-3 on the GUI screen 60 can be moved in parallel by a desired amount from a current position on the GUI screen 60, that is, the optical image 61 by selecting a desired linear guide line 65 by a predetermined operation of the operation input device 34B of the computer portion 34 by the user.

In the alignment sequence of the example, the user, first, selects one linear guide line 65-*m* of the three linear guide lines 65-1, 65-2, and 65-3, for example, the linear guide line 65-1 by operating the operation input device 34B on the GUI screen 60 in the sample table image alignment screen and moves the linear guide line 65-1 in parallel on the GUI screen 60, that is, the optical image 61. Therefore, as illustrated in FIG. 3(*b*), the linear guide line 65-1 is moved and adjusted on the GUI screen 60, that is, the optical image 61 so as to be in contact with the sample table image 62.

Sequentially, the user similarly and sequentially selects one of the remaining two linear guide lines 65-2 and 65-3 one after another and moves the linear guide lines 65-2 and 65-3 in parallel on the GUI screen 60, that is, the optical image 61, and then as respectively illustrated in FIGS. 3(*c*) and 3 (*d*), each of the linear guide lines 65-2 and 65-3 is moved and adjusted so as to be in contact with the sample table image 62 on the GUI screen 60, that is, the optical image 61.

Therefore, if the moving adjustment of each of all the linear guide lines 65 (65-1, 65-2, and 65-3) are completed by the user so as to be in contact with the sample table image 62 on the GUI screen 60, that is, the optical image 61, each of contact points 66 (66-1, 66-2, and 66-3) with the contour S is provided on each, of the linear guide lines 65 (65-1, 65-2, and 65-3) on the GUI screen 60 and the optical image 61. In addition, each of the linear guide lines 65 (65-1, 65-2, and 65-3) constitutes each side of the triangle 68 circumscribing at the contact points 66 (65-1, 66-2, and 66-3) with respect to the circular contour S of the sample table image 62.

If the triangle 68 circumscribing the circular contour S of the sample table image 62 is created on the GUI screen 60 and the optical image 61 using each of the linear guide lines 65 (65-1, 65-2, and 65-3), the user instructs the computer body 34A of the computer portion 34 to perform the recognition of the size and the center position of the sample table image 62 on the optical image 61 of the sample table image 62 having the circular contour 8, and the calculation of the imaging magnification of the optical image 61 by operating the operation input device 34B.

Upon receiving the instruction, the computer body 34A calculates a functional formula of the three linear guide lines 65 (65-1, 65-2, and 65-3) after the moving adjustment based on the parallel movement result on the coordinates of the optical image 61 each of the three linear guide lines 65 (65-1, 65-2, and 65-3) by the user from an initial functional formula of each of the known three linear guide lines 65 (65-1, 65-2, and 65-3) of which the inclinations are different from each other viewed on the coordinates of the optical images 61. Thereafter, the computer body 34A calculates the intersection points 67 (67-1, 67-2, 67-3) on the coordinates of the optical image 61 between two linear guide lines of combinations different from each other in the three linear guide lines 65 (65-1, 65-2, and 65-3) after the moving adjustment, thereby calculating the coordinates of each vertex of the triangle 68 circumscribing the circular contour S of the sample table image 62 on the coordinates of the optical image 61. The computer body 34A performs recognition of the size and the center position of the sample table image 62 on the optical image 61 based on the coordinates of each vertex as the measurement reference points respectively. In this case, the center position of the sample table image 62 on the optical image 61 is not directly recognized by an automatic image analysis which is complicated and troublesome with respect t the contour S of the sample table image 62 on the optical image 61, but can be acquired by calculating an inner center of the triangle 68 from the measurement reference points quickly and easily with high accuracy with the coordinates of each vertex of the triangle 68 as the measurement reference points. In addition, if the center position of the sample table image 62 is specified, the size of the sample table image 62 on the optical image 61 can be easily calculated because the acquisition of a size of a diameter of the circular contour S is also easily and uniquely performed.

Furthermore, the computer body 34A calculates the imaging magnification of the optical image 61 including the sample table image 62 acquired from the imaging device 40 from basic information such as the size of the sample table image 62 on the optical image 61, the actual sample table size and shape input in step S10 of FIG. 2 in advance.

As described above, according to the example, in the optical image 61 including the sample table image 62, the three linear guide lines 65 (65-1, 65-2, and 65-3) are moved and adjusted, and the coordinates of each vertex of the triangle 68 circumscribing the sample table image 62 can be determined by the intersection points 67 (67-1, 67-2, and 67-3) of the two linear guide lines of the combinations different from, each other in the three linear guide lines 65 (65-1, 65-2, and 65-3) after the moving adjustment. The size and the center position of the sample table image 62 on the optical image 61, and the imaging magnification of the optical image 61 including the sample table image 62 can be acquired by simple calculation automatically and quickly with high accuracy from the coordinates of each of the intersection points 67 (7-1, 67-2, and 67-3) which is each vertex of the triangle 68 as the measurement reference points. In addition, since the vertices (intersection points) 67 (67-1, 67-2, and 67-3) of the triangle 68 are the measurement reference points, the user can confirm the correct positions by a contact display of the generation of the contact points 66 (66-1, 66-2, and 66-3) with the contour S of each sample table image 62 of the linear guide lines 65 (65-1, 65-2, and 65-3), respectively as illustrated in FIG. 3(*d*).

In this case, as illustrated in FIG. 3, in the three linear guide lines 65 (65-1, 65-2, and 65-3), it is preferable that the inclination of each linear guide line 65 is determined such a manner that the circular contour S of the sample table image 62 is substantially divided into three. Therefore, regardless of the user, the circumscribed points 66 (66-1, 66-2, and 66-3) which substantially divide the circular contour S into three along a length direction thereof are used as criteria for acquiring the measurement reference points. Therefore, it is possible to acquire the imaging magnification with higher accuracy.

In the example, the three linear guide lines 65 (65-1, 65-2, and 65-3) are moved and adjusted so as to be in contact with the sample table image 62 on the GUI screen 60, that is, on the optical image 61 respectively and individually, but the two linear guide lines 65 (65-1 and 65-2) of the three linear guide lines 65 (65-1, 65-2, and 65-3) are intersected on the GUI screen 60 in advance and are displayed integrally movable in parallel, and a pair of guide lines formed of the two linear guide lines 65 (65-1 and 65-2) and remaining one linear guide lire (65-3) are respectively and individually moved and adjusted so as to be in contact with the sample table image 62 on the GUI screen 60, that the optical image 61.

Second Example

FIG. 4 is an explanatory view of a sample table image alignment sequence according to a second example.

In the first example illustrated in FIG. 3, the three linear guide lines 65 (65-1, 65-2, and 65-3) are moved and adjusted, and the coordinates of each vertex of the triangle 68 circumscribing the sample table image 62, which are the measurement reference points, are determined by the intersection points of the two linear guide lines of the combinations different from each other in the three linear guide lines 65 (65-1, 65-2, and 65-3) after the moving adjustment. On the contrary, in the example, three linear guide lines 65 (65-1, 65-2, and 65-3) are moved and adjusted, coordinates of each vertex of a triangle 68 inscribing a sample table image 62 are measurement reference points, and the coordinates are determined by intersection points of two linear guide lines of combinations different from each other in the three linear guide lines 65 (65-1, 65-2, and 65-3) after the moving adjustment.

Figure 3A:
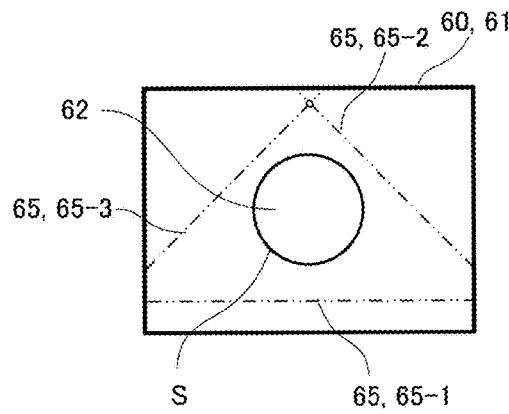
FIGS. 3A-3D are explanatory views of a sample table image alignment sequence according to a first example.
Figure 3B:
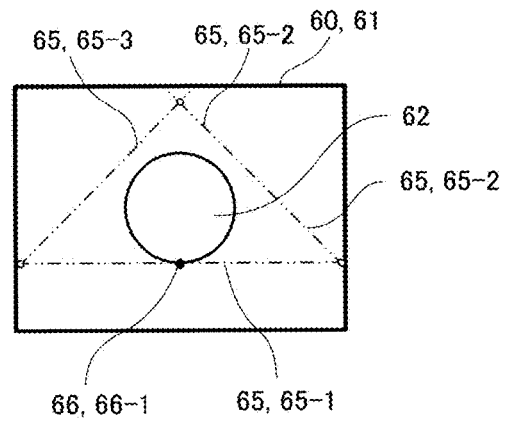
Figure 3C:
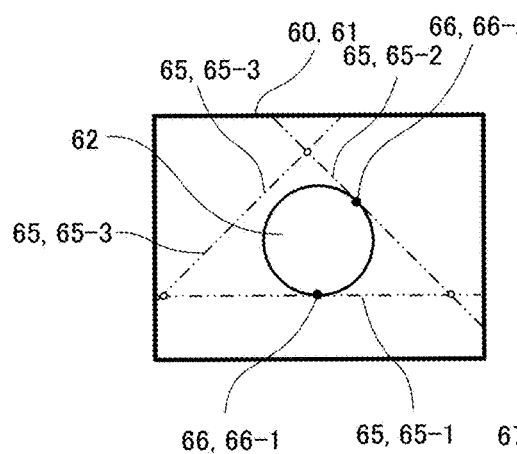
Figure 3D:
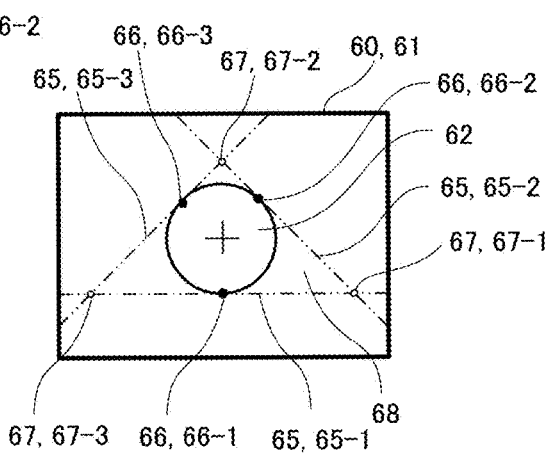
Figure 5A:
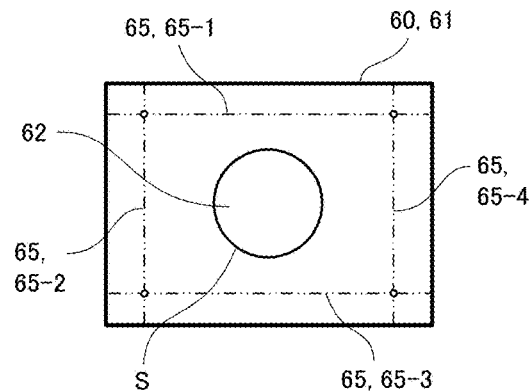
FIGS. 5A-5E are explanatory views of a sample table image alignment sequence according to a third example.
Figure 5B:
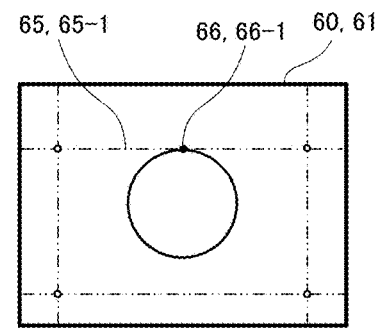
Figure 5C:
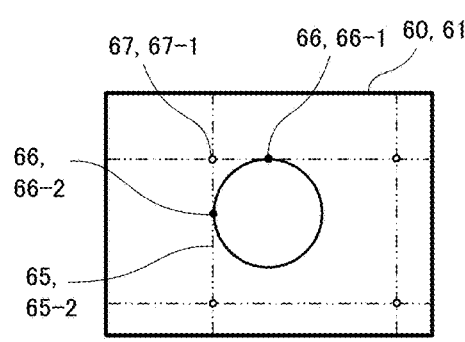
Figure 5D:
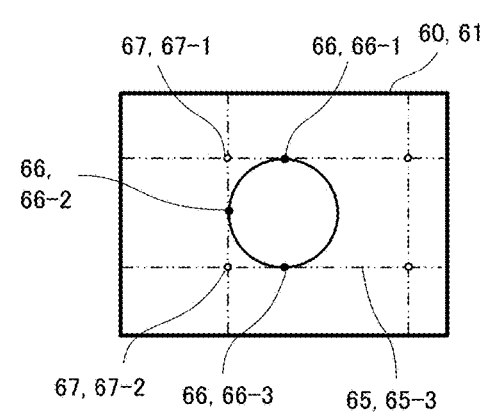
Figure 5E:
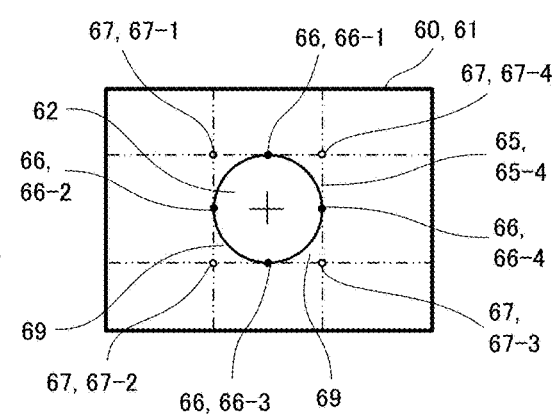
Figure 6A:
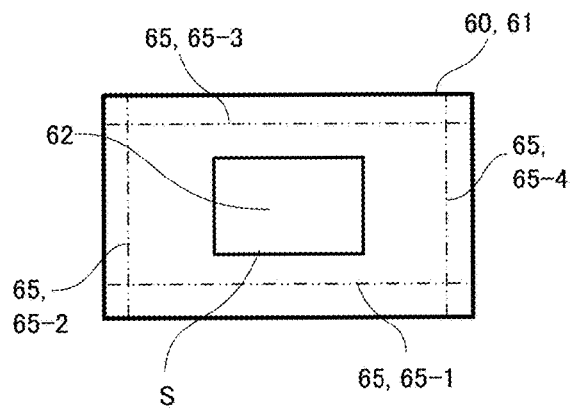
FIGS. 6A-6E are explanatory views of a sample table image alignment sequence according to a fourth example.
Figure 6B:
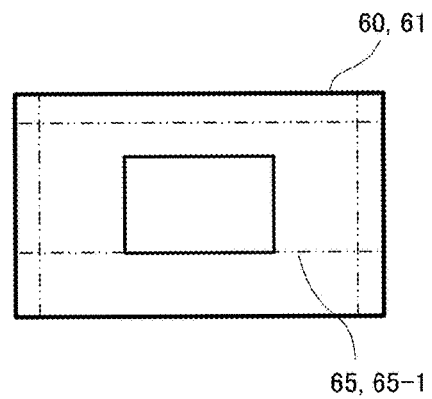
Figure 6C:
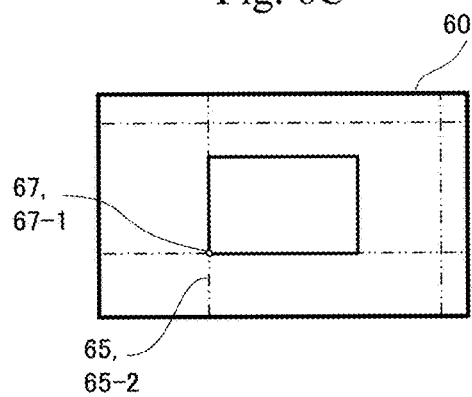
Figure 6D:
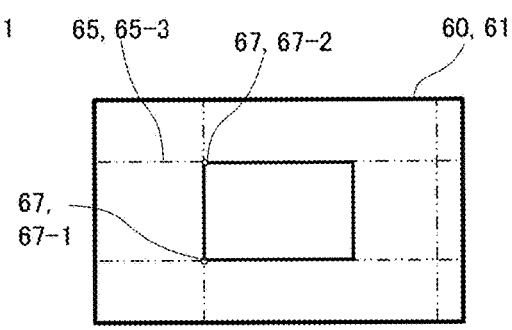
Figure 6E:
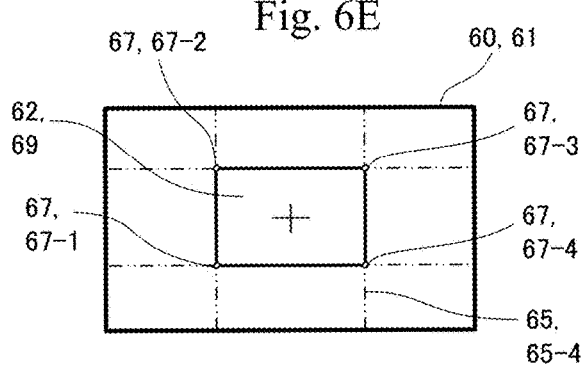

In the example, an initial GUI screen 60 illustrated in FIG. 4(a) before the moving adjustment of the three linear guide lines 65 (65-1, 65-2, and 65-3) is the same as the initial GUI screen 60 illustrated in FIG. 3(a) of the first example.

Thereupon, in the example, a user selects, for example, the linear guide line 65-1 by operating an operation input device 34B on a GUI screen 60 in a sample table image alignment screen and moves the linear guide line 65-1 in parallel on the GUI screen 60, that is, an optical image 61. Therefore, as illustrated in FIG. 4(b), the linear guide line 65-1 is moved and adjusted, on the GUI screen 60, that is, the optical image 61 so as to intersect with two intersection points 66-1 and 66-3 with the contour S of the sample table image 62.

Sequentially, the user similarly and sequentially selects one of the remaining two linear guide lines 65-2 and 65-3 one after another and moves the linear guide lines 65-2 and 65-3 in parallel on the GUI screen 60, that is, the optical image 61, and then as respectively illustrated in FIGS. 4(c) and 4(d), each of the linear guide lines 65-2 and 65-3 is moved and adjusted so as to intersect with the linear guide line 65-1 on the two intersection points 66-1 and 66-3 defined in the linear guide line 65-1.

Therefore, a triangle of which vertices are the three intersection points 67 (67-1, 67-2, and 67-3) of the three linear guide lines 65 (65-1, 65-2, and 65-3) is similarly defined and, as illustrated in FIG. 4(d), in a case where the intersection point 67-2 of the remaining two linear guide lines 65-2 and 65-3 is not positioned on the contour S of the sample table image 62 (in other words, apart from the intersection point 67-2, respective intersection points 66-2 and 66-2 of the remaining two linear guide lines 65-2 and 65-3 with the contour S of the sample table image 62 are present), the three intersection points 67 (67-1, 67-2, and 67-3) are not treated as the measurement reference points. In such a case, as illustrated in FIG. 4(e), for the three linear guide lines 65 (65-1, 65-2, and 65-3), the user moves and adjusts the three linear guide lines 65 (65-1, 65-2, and 65-3) respectively so that the three intersection points 67 (67-1, 67-2, and 67-3) are respectively positioned on the contour S of the sample table image 62.

According to the example, as the measurement reference points, the coordinates of each vertex of the triangle 68 inscribing the sample table image 62 can be determined by the intersection points 67 (67-1, 67-2, and 67-3) of the two linear guide lines of the combinations different from each other in the three linear guide lines 65 (65-1, 65-2, and 65-3) after final moving adjustment. The center position of the sample table image 62 on the optical image 61 is not directly recognized by an automatic image analysis which is complicated and troublesome with respect to the contour S of the sample table image 62 on the optical image 61, but the size and the center position of the sample table image 62 on the optical image 61, and the imaging magnification of the optical image 61 including the sample table image 62 can be acquired by calculating an outer center from the coordinates of each of the intersection points 67 (67-1, 67-2, and 67-3) that is each vertex of the triangle 68 as the measurement reference points automatically and quickly with high accuracy in a simple calculation. In addition, since the vertices (intersection points) 67 (67-1, 67-2, and 67-3) of the triangle 68 are the measurement reference points, the user can confirm the coincidence of intersection points 66 (66-1, 66-2, and 66-3) of the respective linear guide lines 65 (65-1, 65-2, and 65-3) with the contour S of the sample table image 62 by extinguishing the intersection point 66 as illustrated in FIG. 4(e).

In this case, as illustrated in FIG. 4, in the three linear guide lines 65 (65-1, 65-2, and 65-3), it, is preferable that the inclination of each linear guide line 65 is determined such a manner that the circular contour S of the sample table image 62 is substantially divided into three. Therefore, regardless of the user, the circumscribed points 66 (66-1, 66-2, and 66-3) which substantially divide the circular contour S into three along a length direction thereof are used as criteria for acquiring the measurement reference points. Therefore, it is possible to acquire the imaging magnification with higher accuracy.

Third Example

FIG. 5 is an explanatory view of a sample table image alignment sequence according to a third example.

In the first and second examples, the contact points or the intersection points 66 are designated on the three linear guide lines 65 (65-1, 65-2, and 65-3). However, it is clear that it is also possible, to designate the contact points or the intersection points on three linear guide lines 65 or more.

For example, linear guide lines 65 (65-1, 65-2, 65-3, and 65-4) respectively parallel to each side of a regular polygon 69 having four sides or more are displayed on a GUI screen 60, the linear guide lines 65 are, respectively moved and adjusted, and each vertex 67 of the regular polygon 69 circumscribing a sample table image 62 is set as a measurement reference point.

FIG. 5 illustrates an example in which, for example, the linear guide lines 65 (65-1, 65-2, 65-3, and 65-4) respectively parallel to each side of the square (regular polygon) 69 are displayed on the GUI screen 60, similar to the case of the first example illustrated in FIG. 3, each vertex 67 of the square 69 circumscribing the sample table image 62 is set as the measurement reference point in a procedure illustrated in FIGS. 5(*a*) to 5(*e*).

According to the example, the coordinates of each vertex of the regular polygon (square in the case of FIG. 5) 69 circumscribing the sample table image 62 can be determined by the intersection points (four of 67-1 to 67-4 in the case of FIG. 5) of two linear guide lines of combinations different from each other in a plurality of linear guide lines 65 (four of 65-1 to 65-4 in the case of FIG. 5) after the moving adjustment. The center position of the sample table image 62 on the optical image 61 is not directly recognized by an automatic image analysis which is complicated and troublesome with respect to the contour S of the sample table image 62 on the optical image 61, but the size and the center position of the sample table image 62 on the optical image 61, and the imaging magnification of the optical image 61 including the sample table image 62 can be acquired by calculating a center (inner center in the case of FIG. 5) from the coordinates of each of intersection points 67 (four of 67-1 to 67-4 in the case of FIG. 5) that is each vertex of the regular polygon (square in the case of FIG. 5) 69 automatically and quickly with high accuracy in a simple calculation. In addition, according to the example, it can also be used for a sample table of an ellipse.

Fourth Example

FIG. 6 is an explanatory view of a sample table image alignment sequence according to a fourth example.

In the example, a contour S of a sample table image 62 on the optical image 61 is rectangular.

In the case of the example, similar to the case of the third example, coordinates of each vertex of a rectangle 69 matching the sample table image 62 are measurement reference points and can be determined by intersection points 67 (67-1 to 67-4) of two linear guide lines of combinations different from each other in a plurality of linear guide lines 65 (65-1 to 65-4) after the moving adjustment. The center position of the sample table image 62 on the optical image 61 is not directly recognized by an automatic image analysis which is complicated and troublesome with respect to the contour S of the sample table image 62 on the optical image 61, but the size and the center position of the sample table image 62 on the optical image 61, and the imaging magnification of the optical image 61 including the sample table image 62 can be acquired by calculating a center (center of gravity in the case of FIG. 6) from the coordinates of each of intersection points 67 (four of 67-1 to 67-4 in the case of FIG. 6) that is each vertex of the rectangle 69 of the sample table image 62 automatically and quickly with high accuracy in a simple calculation. In the example, particularly, the sample table of a square can be acquired quickly with high accuracy.

Fifth Example

Figure 7:
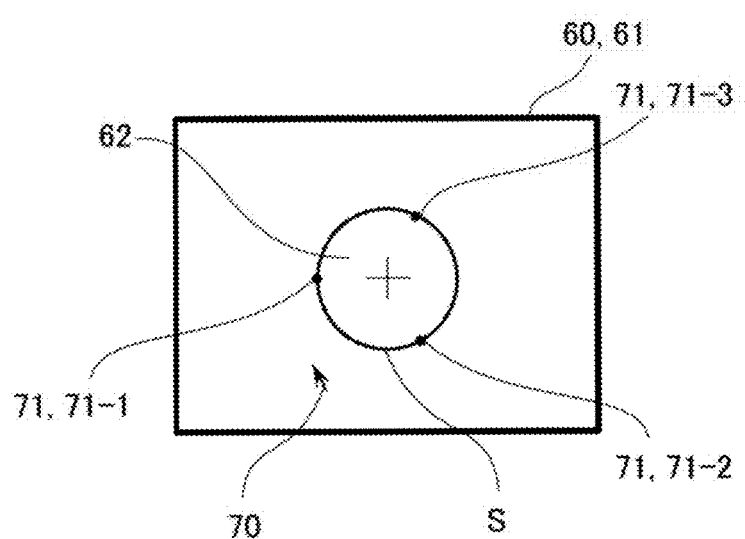
FIG. 7 is an explanatory view of a sample table image alignment sequence according to a fifth example.

FIG. 7 is an explanatory view of a sample table image alignment sequence according to a fifth example.

In the fifth example, unlike the cases of the first to fourth examples, the linear guide lines 65 used in the examples are not used and instead of the linear guide lines 65, a pointer 70 movable on the GUI screen 60 is displayed by an operation of an operation input device 34B on the initial GUI screen 60, the pointer 70 is moved and dropped on a contour shape S on the optical image 61 including the sample table image having, for example, a contour S such as a circle, a rectangle, parallelogram, and a regular polygon. Therefore, a plurality of points are directly set as measurement reference points on the contour of the sample table image 62.

As illustrated in the drawing, in a case where the optical image 61 in which the contour S of the sample table image 62 on the optical image 61 is, for example, a circle is acquired from an imaging device 40, as illustrated in FIG. 7, at least three points 71 (71-1, 71-2, and 71-3) on the contour are set as the measurement reference points by moving and dropping the pointer 10 for each point on the GUI screen 60. Therefore, it is possible to define a triangle inscribing the sample table image 62 having the contour S of the circle on the GUI screen 60 on the optical image 61.

According to the example, the contour S of the sample table image 62 on the optical image 61 is not directly recognized by an automatic image analysis which is complicated and troublesome, but the size and the center position of the sample table image 62 on the optical image 61, and the imaging magnification of the optical image 61 including the sample table image 62 can be acquired by calculating an outer center thereof from the coordinates of each of intersection points 71 (71-1, 71-2, and 71-3) that is each vertex of the triangle 68 inscribing the sample table image 62 as the measurement reference points quickly with a small number of man-hour.

Sixth Example

Figure 8A:
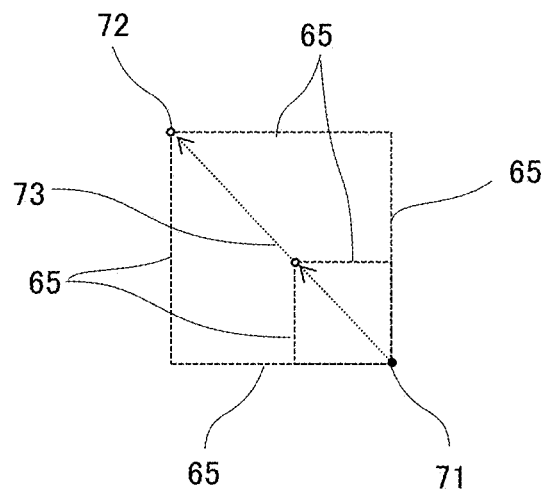
FIGS. 8A-8B are explanatory views of a sample table image alignment sequence according to a sixth example.
Figure 8B:
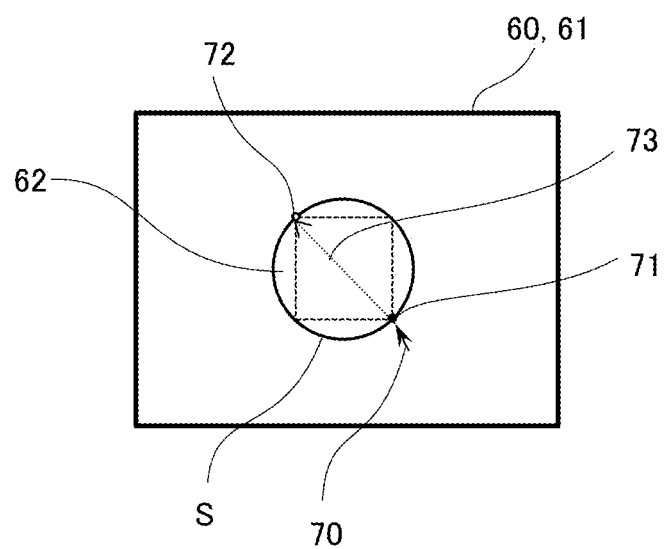

FIG. 8 is an explanatory view of a sample table image alignment sequence according to a sixth example.

In the example, in a diameter or a diagonal of a contour S of a sample table image 62, first, arbitrary one point on a contour of an optical image 61 including the sample table image 62 is designated as a start point 71 by the pointer 70 and an end point 72 of a line segment 73 extending from the start point 71 is set on the optical image 61 including the sample table image by dragging and dropping the pointer 70 from the start point 71 to another arbitrary one point on the contour of the sample table image 62.

While the pointer 70 is being dragged, the linear guide line 65 which is configured of the remaining two sides of the right triangle of which a hypotenuse is the current line segment 73, or each side of a rectangular shape of which a diagonal is the current line segment 73 is, as illustrated in FIG. 8(*a*), displayed on the optical image 61 including the sample table image along with the drag of the line segment 73 on the optical image 61. Therefore, as illustrated in Fig. (a), the diameter or the diagonal related to the contour S of the sample table image 62 can be set on the optical image 61 by dragging and dropping the line segment 73 while confirming the linear guide line 65. In the example, the start point 71 and the end point 72 of the line segment 73 obtained by dragging and dropping the diameter or the diagonal related to the contour S of the sample table image 62 are the measurement reference points. Therefore, the imaging magnification can be obtained quickly with a small number of man-hour.

Seventh Example

FIG. 9 is an explanatory view of a sample table image alignment sequence according to a seventh example.

In the first and second examples illustrated in FIG. 3, in order to determine the coordinates of each vertex of the triangle 68 circumscribing or inscribing the sample table image 62 which are the measurement reference points by intersection points of two linear guide lines of combinations different from each other in the three linear guide lines 65 (65-1, 65-2, and 65-3) after the moving adjustment, each of the three linear guide lines 65 (65-1, 65-2, and 65-3) is moved in parallel and moved, and adjusted. However, in the example, the three linear guide lines 65 (65-1, 65-2, and 65-3) are configured of two types of linear guide lines 65p and 65r formed of parallel moving linear guide lines 65p (65-1 and 65-3) which are moved in parallel and moved, and adjusted, and a inclined displacement linear guide line 65r (65-2) which is inclined (rotated) and displaced to be moved and adjusted.

Figure 9A:
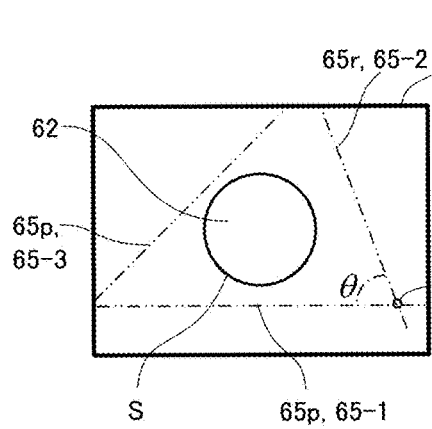
FIGS. 9A-9D are explanatory views of a sample table image alignment sequence according to a seventh example.

In the example, an initial GUI screen 60 illustrated in FIG. 9(a) before the moving adjustment of the three linear guide lines 65-1, 65-2, and 65-3 is the same as the initial GUI screen 60 illustrated in FIG. 3(a) of the first example.

Figure 9B:
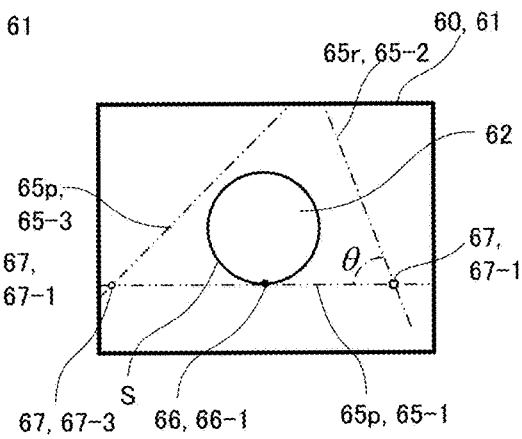

In addition, in the example, the user operates the operation input device 34B on the GUI screen 60 on the sample table image alignment screen, selects, for example, the parallel moving linear guide lines 65-1 (65p), moves the parallel moving linear guide line 65-1 (65p) on the GUI screen 60, that is, the optical image 61 in parallel, and then, as illustrated in FIG. 9(b), moves and adjusts the parallel moving linear guide line 65-1 (65p) on the GUI screen 60, that is, the optical image 61 so as to be in contact with the contour S of the sample table image 62 at a contact point 66-1.

Figure 9C:
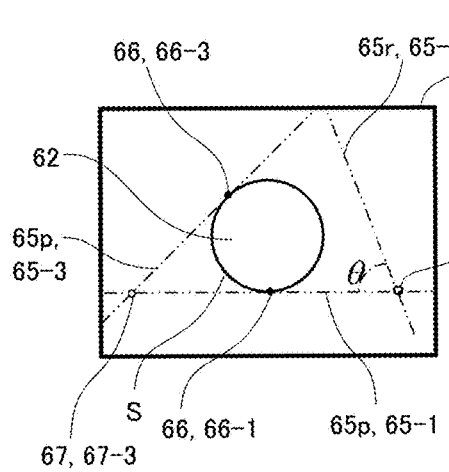

Sequentially, the user also similarly selects the remaining one parallel moving linear guide line 65-3 (65p), moves the parallel moving linear guide line 65-3 (65p) on the GUI screen 60, that is, the optical image 61 in parallel, and then, as illustrated in FIG. 9(c), moves and adjusts the parallel moving linear guide line 65-3 (65p) on the GUI screen 60, that is, the optical image 61 so as to be in contact with the contour S of the sample table, image 62 at a contact point 66-3.

Figure 9D:
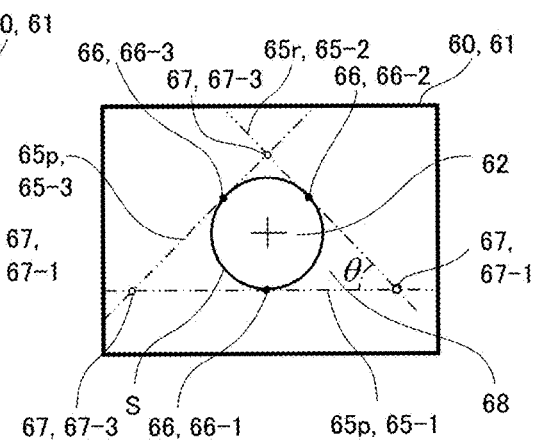
Figure 10A:
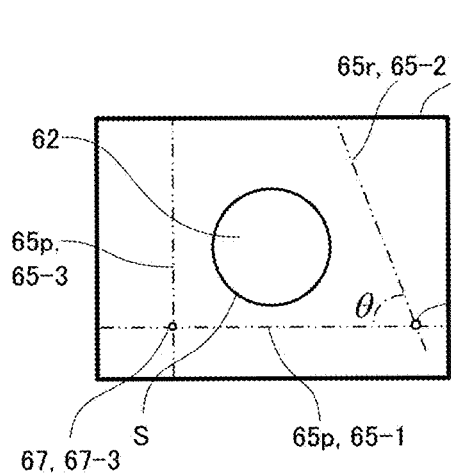
FIGS. 10A-10D are explanatory views of a modification example of a sample table image alignment sequence according to the seventh example.
Figure 10B:
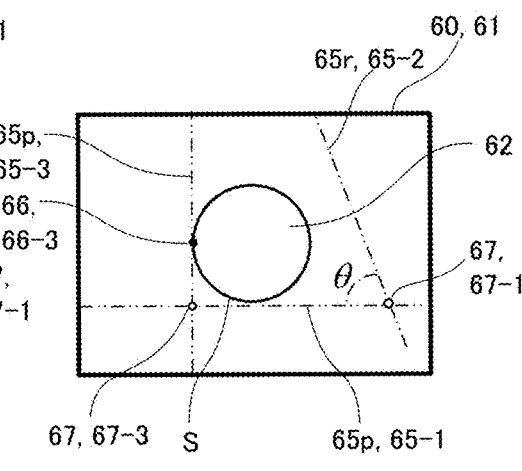
Figure 10C:
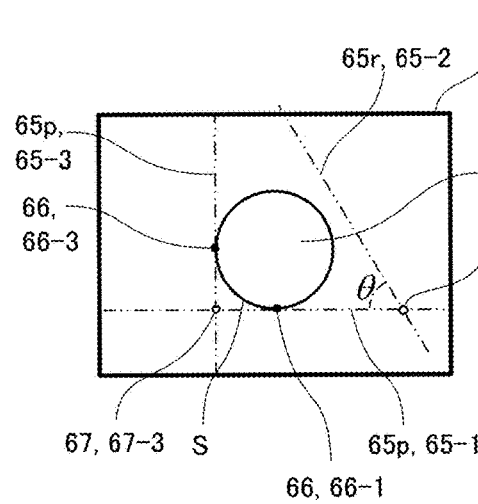
Figure 10D:
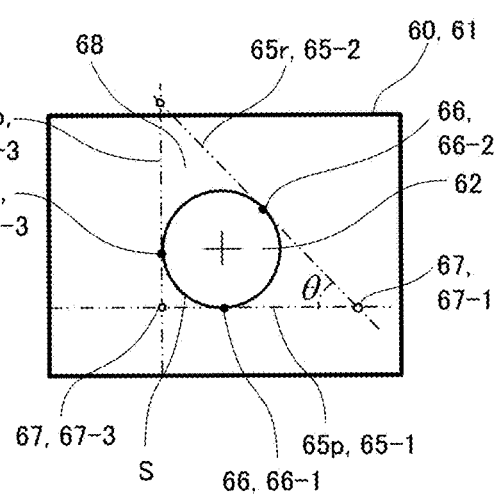
Figure 11A:
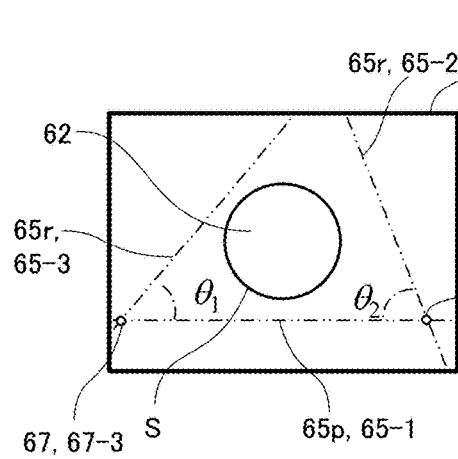
FIGS. 11A-11D are explanatory views of a modification example of a sample table image alignment sequence according to the seventh example.
Figure 11B:
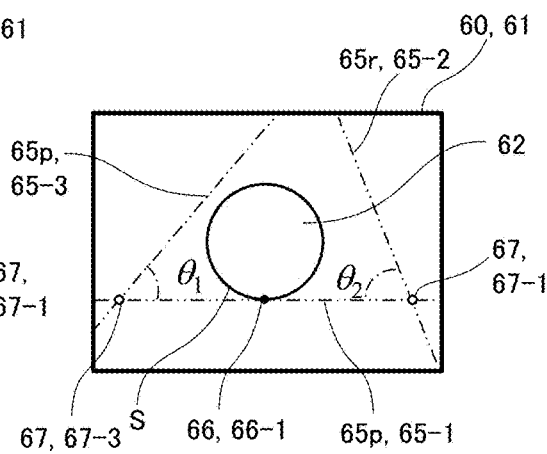
Figure 11C:
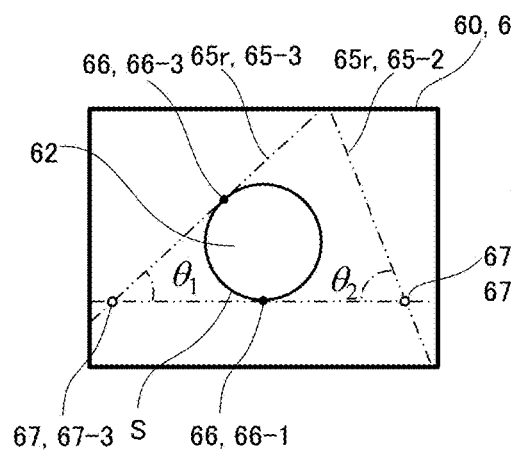
Figure 11D:
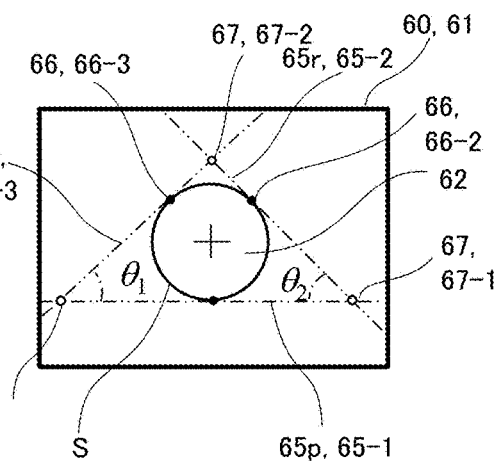

In addition, the user selects the remaining one inclined displacement linear guide line 65-2 (65r), inclines (rotates) and displaces the inclined displacement linear guide line 65-2 (65r) on the GUI screen 60, that is, the optical image 61, and then, as illustrated in FIG. 9(d), moves and adjusts the inclined displacement linear guide line 65-2 (65r) on the GUI screen 60 that is, on the optical image 61 so as to be in contact with the contour S of the sample table image 62 at a contact point 66-2.

Here, the inclined (rotated) displacement of the inclined displacement linear guide line 65-2 (65r) is performed in such a manner that a center point thereof is a intersection point 67-1 or 67-3 (not illustrated in FIG. 9(c)) with the parallel moving linear guide line 65-1 (65p) or 65-1 (65p) which is moved and adjusted so as to be in contact with the inclined displacement linear guide line 65-2 (65r) and the contour S of the sample table image 62 at the contact point 66-1 or 66-3. In the illustrated example, the inclined (rotated) displacement is performed with the intersection point 67-1 as the center point, but the inclined (rotated) displacement may be performed with the intersection point 67-3 as the center point. Furthermore, before the moving adjustment of the inclined displacement linear guide line 65-2 (65r), the user selects one of the selected intersection points 67-1 or 67-3, and may set as the center point.

In addition, an operating method of the inclined (rotated) displacement of the inclined displacement linear guide line 65-2 (65r) is performed by directly operating the inclination (rotation) of the inclined displacement linear guide line 65-2 or setting and inputting a value of an intersecting angle ⌀ between the inclined displacement linear guide line 65-2 (65r) and the parallel moving linear guide line 65-1 (65p) or 65-1 (65p) defining the center point.

Therefore, as the measurement reference points, the coordinates of each vertex of the triangle 68 circumscribing the sample table image 62 can be determined by intersection points 67 (67-1, 67-2, and 67-3) of two linear guide lines of combinations different from each other in the three linear guide lines 65 (65-1, 65-2, and 65-3) after the final moving adjustment. The center position of the sample table image 62 on the optical image 61 is not directly recognized by an automatic image analysis which is complicated and troublesome with respect to the contour S of the sample table image 62 on the optical image 61, but the size and the center position of the sample table image 62 on the optical image 61, and the imaging magnification of the optical image 61 including the sample table image 62 can be acquired by calculating the inner center from the coordinates of each of intersection points 67 (67-1, 67-2, and 67-3) that is each vertex of the triangle 68 as the measurement reference points automatically and quickly with high accuracy in a simple calculation. In addition, since the vertices (intersection points) 67 (67-1, 67-2, and 67-3) of the triangle 68 are the measurement reference points, the user can confirm the correct positions thereof by the generation of the contact points 66 (66-1, 66-2, and 66-3) with the contour S of the sample table image 62 each of the linear guide lines 65 (65-1, 65-2, and 65-3) by the contact display as illustrated in FIG. 9(d).

Moreover, in FIG. 9, a procedure, in which the parallel moving linear guide lines 65-1 (65p) and 65-3 (65p) are moved and adjusted so as to be in contact with the contour S of the sample table image 62 at the contact points 66-1 and 66-3, and then the inclined displacement linear guide line 65-2 (65r) is moved and adjusted. As illustrated in FIG. 9(a), the parallel moving linear guide line 65-1 (65p) is moved and adjusted so as to be in contact with the contour S of the sample table image 62 at the contact point 66-1 and then the inclined displacement linear guide line 65-2 (65r) is moved and adjusted. Thereafter, even if the parallel moving linear guide line 65-3 (65p) is moved and adjusted, as illustrated in FIG. 9(d), it is possible to obtain a state where the linear guide lines 65-1 to 65-3 are respectively in contact with the contour S of the sample table image 62 at the contact points 66-1 to 66-3.

FIGS. 10 and 11 are respective explanatory views of modification examples of a sample table image alignment sequence according to the seventh example illustrated in FIG. 9.

In the modification example illustrated in FIG. 10, three linear guide lines 65 (65-1, 65-2, and 65-3) are configured of two types of linear guide lines 65p and 65r formed of parallel moving linear guide lines 65p (65-1 and 65-3) which are moved in parallel so as to be moved and adjusted, and an inclined displacement linear guide line 65r (65-2) which is inclined (rotated) and displaced so as to be moved and adjusted. The configuration is the same as that of the seventh example illustrated in FIG. 9. However, two parallel moving linear guide lines 65-1 (65p) and 65-3 (65P) are set to be orthogonal to each other in advance.

In addition, in the modification example illustrated in FIG. 11, three linear guide lines 65 (65-1, 65-2, and 65-3) are configured of two types of linear guide lines 65p and 65r. The configuration is the same as that of the seventh example illustrated in FIG. 9. However, the number of configurations of each of the two types of the linear guide lines 65p and 65r, which are formed of a parallel moving linear guide line 65p (65-1) which is moved in parallel to be moved and adjusted, and inclined displacement linear guide lines 65r (65-2 and 65-3), is different from that of the seventh example of FIG. 9.

Moreover, in the example, the inclined (rotated) displacement of the inclined displacement linear guide line 65r is automatically set with an intersection point with a predetermined parallel moving linear guide line 65p as a center point when performing the inclined (rotated) displacement, but it is also possible to move the center point to a desired point on the predetermined parallel moving linear guide line 65p by a predetermined operation by the user. As in the second example illustrated in FIG. 4, this case can also be applied to a sample table image alignment sequence in which the triangle 68 defined by each of the linear guide lines 65-1 to 65-3 which are moved and adjusted inscribes the contour S of the sample table image 62 and it is possible to obtain the vertices (intersection points) 67 (67-1, 67-2, and 67-3) of the inscribing triangle 68 with easier operation than a case where the three linear guide lines 65 (65-1, 65-2, and 65-3) are configured of parallel moving linear guide lines 65p.

As described above, the scanning electron microscope 1 according to the embodiments is configured, but the charged particle beam apparatus according to the embodiments of the invention is not limited thereto and various modifications of the embodiments are included.

Figure 12:
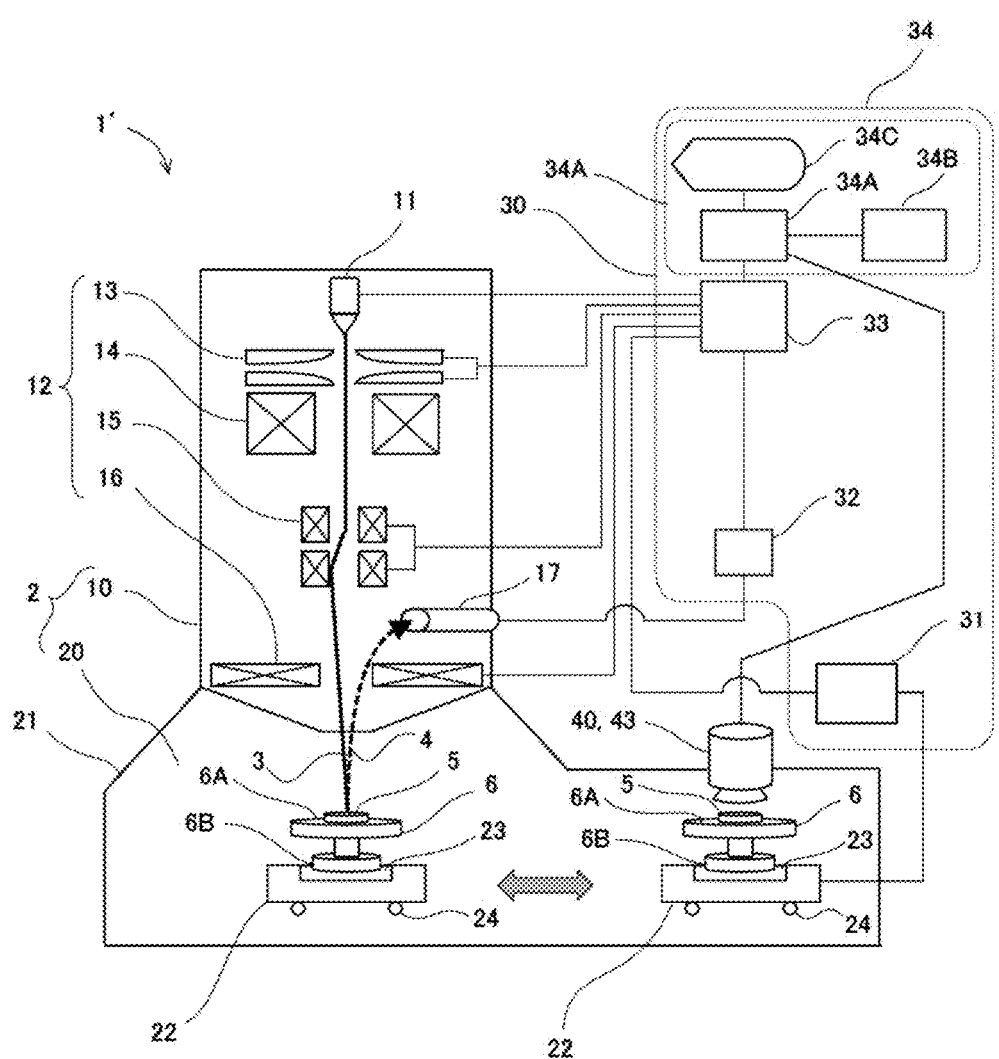
FIG. 12 is a schematic configuration view of another example of a scanning electron microscope as a charged particle beam apparatus according to another embodiment of the invention.

FIG. 12 is a schematic configuration view of another example of a scanning electron microscope as a charged particle beam apparatus according to another embodiment of the invention.

In the scanning electron microscope 1 illustrated in FIG. 1, the imaging device 40 is provided outside the sample chamber 20 of the scanning electron microscope 1 separately from the microscope device body 2, but in a scanning electron microscope 1' according to the embodiment, as illustrated in FIG. 12, an imaging device 40 is different from that of the embodiment of FIG. 1 in that it has a structure that is integrally provided with a microscope device body 2 with an imaging surface side of a CCD camera 4 of the imaging device 40 facing an inside of a sample chamber 20. Accordingly, in the scanning electron microscope 1', the imaging device 40 within the sample chamber 20 is provided in the sample chamber housing 21, or the stage 22 can move and displace a mounted portion 23 between an observation position irradiated with an electron beam 3 and an imaging position by the COD camera 43, so that in the sample chamber 20, for example, moving positions of the observation position irradiated with the electron beam 3 from the lens barrel 10 and the imaging device 40 by the COD camera 43 of the imaging device 40 on the horizontal plane regarding the mounted portion 23 of the stage 22 are at the same position, and an optical axis direction of an electron optical system 12 and the imaging direction of the CCD camera 43 can intersect with each other on a placement surface 6A of a sample table 6 mounted on the mounted portion 23 of the stage 22. Therefore, the observation position irradiated with the electron beam 3 from a lens barrel 10 and a moving position of the mounted portion 23 of the stage 22 on which the sample table 6 is detachably mounted in the horizontal plane can be at the same position.

Therefore, according to the scanning electron microscope 1' of the embodiment, it is not necessary to open an operable and closable inlet/outlet port of the sample 5 provided in the sample chamber housing 21 between the acquisition of the captured image and the acquisition of the observation image. It is possible to acquire an optical image used for setting a viewing field range or an optical image 61 including a sample table image 62 for a sample table image alignment within the sample chamber housing 21 which is in a vacuum state for the sample observation. It is possible to continue the acquisition of the observation image related to a set viewing field range within the sample chamber housing 21 as it is.

In addition, in the scanning electron microscopes 1 and 1' of the embodiments, in the first to fourth embodiments according to the GUI screen 60 on which the optical image 61 including the sample table image 62 is displayed on the sample table image alignment screen, as illustrated in FIGS. 3 to 6 respectively, the plurality of linear guide lines 65 which are different from each other are displayed in advance. However, the linear guide lines 65 are not initially displayed on the GUI screen 60, instead thereof, a plurality of icons of the linear guide lines 65 are selectably displayed on the sample table image alignment screen and whenever the user selects an icon of a desired linear guide line 65, the linear guide 65 corresponding to the selected icon may be displayed on the GUI screen 60.

For example, icons respectively corresponding to the linear guide lines 65-1, 65-2, and 65-3 illustrated in FIG. 3, and icons respectively corresponding to the linear guide lines 65-1 and 65-2 illustrated in FIG. 5 are respectively provided on the sample table image alignment screen, and, among them, an icon of a linear guide, line 65-x of a desired type used by the user can also be selected according to the contour S of the sample table image 62 in the optical image 61. In this case, the number of icons, that is, the types of the linear guide lines 65 is not, limited to the linear guide lines 65 illustrated in the first to fourth embodiments and icons of various types of the linear guide lines 65 may be provided. In addition, the linear guide 65 itself may has a polygonal line shape formed by integrating the plurality of linear guide lines 65 described in the third embodiment with reference to FIG. 5 or the like, and is not limited to a simple linear shape.

As described above, the configuration of the charged particle beam apparatus according to the invention is not limited to the embodiments and includes various modified examples. The specific configurations in the embodiments described above are for the purpose of understanding the present invention and are not necessarily limited to those having all the specific configurations described above. For example, it is possible to replace a part of the specific configuration of an embodiment with a specific configuration of another embodiment, and the specific configuration of an embodiment may be added to the specific configuration of other embodiment. In addition, it is possible to add, delete, or replace other configurations with respect to a part of the specific configuration of each embodiment.

In addition, each of the configurations, the functions, the processing portions, the processing units, and the like may be realized by hardware, for example, by designing some or all of them with an integrated circuit or the like. In addition, each of the configurations, the functions, and the like may be realized by software interpreting and executing programs of which each function is realized by a computer. Information such as programs, tables, files, and the like that realize each function can be stored in a memory, a hard disk, a solid state drive (SSD), or a recording medium such as an IC card, an a SD card, or a DVD.

REFERENCE SIGNS LIST 1, 1' scanning electron microscope,
2 microscope device body, 3 electron beam,
4 signal particle, 5 sample, 6 sample table,
6A placement surface, 6B mounting portion,
S contour shape, 10 lens barrel, 11 electron gun,
12 electron optical system, 13 anode,
14 condenser lens, 15 deflector, 16 objective lens,
17 detector, 20 sample chamber,
21 sample chamber housing, 22 stage,
23 mounted portion, 24 moving mechanism,
30 control device, 31 stage control portion,
32 signal processing portion,
33 apparatus control portion, 34 computer portion,
34A computer body, 343 operation input device,
340 display device, 40 imaging device,
41 mounting table, 42 stand, 43 COD camera,
44 mounted portion, 60 GUI screen,
61 optical image including sample table image,
62 sample table image, 65 linear guide line,
66 contact point, 67 intersection point,
68 triangle, 69 square (regular polygon),
70 pointer, 71 start point, 72 end point,
73 line segment All publications, patents and patent applications cited in this specification are incorporated herein by reference in their entirety.

The invention claimed is:

1. A charged particle beam apparatus comprising:
   a charged particle source that emits a charged particle beam;
   a charged particle optical system that irradiates a sample with the charged particle beam from the charged particle source;
   a sample chamber in which a sample table on which the sample is placed is accommodated;
   a stage that holds the sample table within the sample chamber and moves the sample together with the sample table within the sample chamber to change an irradiation position and/or an irradiation direction of the charged particle beam from the charged particle optical system with respect to the sample;
   a detector that detects signal particles generated from the sample placed on the sample table by irradiation with the charged particle beam;
   an image processing portion that generates an observation image of an observation range on the sample irradiated with the charged particle beam based on the signal particles detected by the detector;
   an image display portion that displays a captured image including a sample table image of the acquired sample table by an imaging device;
   an operation input portion that sets and inputs a measurement reference point by designating points positioned apart from each other on a contour of the sample table image on a captured image displayed on the image display portion;
   a sample table image size calculation portion that calculates a size of the sample table image on the captured image based on a distance on the captured image between a plurality of measurement reference points which are set and input by an operation of the operation input portion; and
   an imaging magnification calculation portion that calculates an imaging magnification of the captured image from a size of the sample table image calculated by the sample table image size calculation portion and an actual size of the sample table.

2. The charged particle beam apparatus according to claim 1,
   wherein an observation range on the sample for acquiring the observation image by being irradiated with the charged particle beam on the captured image of the sample table on which the sample is placed, which is acquired with the same magnification as the imaging magnification calculated by the imaging magnification calculation portion, is set as a viewing field range, and when acquiring an observation image of an observation range on the sample corresponding to the viewing field range, the imaging magnification calculated by the imaging magnification calculation portion is used in an alignment of the charged particle optical system and/or the stage related to an irradiation position of the charged particle beam.

3. The charged particle beam apparatus according to claim 1,
   wherein the plurality of measurement reference points which are set and input by the operation of the operation input portion are each vertex of a polygon circumscribing or inscribing a contour of the sample table image in the captured image displayed on the image display portion.

4. The charged particle beam apparatus according to claim 1,
   wherein the measurement reference points are displayed on the image display portion together with the captured image and are set and input by respectively moving a plurality of linear guide lines of which extending directions are different from each other on a display screen of the image display portion in accordance with the operation of the operation input portion and designating a contact point between each linear guide line and a contour of the sample table image in the captured image, or an intersection point between two linear guide lines having different combination from each other and the contour of the sample table image in the captured image.

5. The charged particle beam apparatus according to claim 4,
   wherein the plurality of linear guide lines having different extending direction from each other are a plurality of parallel moving linear guide lines which are able to be moved in parallel on the display screen of the image display portion, or are a combination of at least one parallel moving linear guide line which is able to be moved in parallel on the display screen of the image display portion and a remaining inclined displacement linear guide line which is able to be inclined and displaced on the display screen of the image display portion.

6. The charged particle beam apparatus according to claim 1,
   wherein the measurement reference points are set and input by directly plotting the operation of the operation input portion on the contour of the sample table image on the display screen of the image display portion on which the captured image including the sample table image is displayed.

7. The charged particle beam apparatus according to claim 6,
wherein if the measurement reference points which are already set and input are displayed and a pair of measurement reference points is set, remaining vertices of a right triangle or a rectangle in which a linear line connecting the pair of measurement reference points is set as a hypotenuse or a diagonal is displayed to be guided on the display screen of the image display portion on which the captured image including the sample table image is displayed.

8. An alignment method of a charged particle beam apparatus, the method comprising:
a viewing field range setting step of setting an observation range on a sample for acquiring an observation image by a charged particle beam apparatus on a captured image of the sample acquired by an imaging device as a viewing field range;
an alignment step of using an imaging magnification of a captured image by the imaging device used in setting of the viewing field range for an alignment of an irradiation position of a charged particle beam when acquiring the observation image of the sample by irradiating the observation range on the sample corresponding to the viewing field range with the charged particle beam by the charged particle beam apparatus;
a sample table image display step of displaying the captured image including the sample table image of the sample table on which the sample is placed which is acquired by the imaging device on an image display portion;
an operation setting step of setting and inputting a measurement reference point by designating points that are positioned apart from each other on a contour of the sample table image based on an operation of an operation input portion on the captured image displayed on the image display portion by the sample table image display step;
a sample table image size calculating step of calculating a size of the sample table image on the captured image based on a distance on the captured image between a plurality of measurement reference points which are set and input by the operation setting step; and
an imaging magnification calculating step of calculating an imaging magnification of the captured image from a size of the sample table image calculated by the sample table image size calculating step and an actual size of the sample table.

9. The alignment method of a charged particle beam apparatus according to claim 8,
wherein in the operation setting step, the plurality of measurement reference points which are set and input by the operation of the operation input portion are respectively vertices of a polygon circumscribing or inscribing a contour of the sample table image in the captured image displayed on the image display portion.

10. The alignment method of a charged particle beam apparatus according to claim 8,
wherein in the operation setting step, the measurement reference points are displayed on the image display portion together with the captured image and are set and input by respectively moving a plurality of linear guide lines of which extending directions are different from each other on a display screen of the image display portion in accordance with the operation of the operation input portion and designating a contact point between each linear guide line and a contour of the sample table image in the captured image, or an intersection point between two linear guide lines having different combination from each other and the contour of the sample table image in the captured image.

11. The alignment method of a charged particle beam apparatus according to claim 10,
wherein the plurality of linear guide lines having different extending direction from each other are a plurality of parallel moving linear guide lines which are able to be moved in parallel on the display screen of the image display portion, or are a combination of at least one parallel moving linear guide line which is able to be moved in parallel on the display screen of the image display portion and a remaining inclined displacement linear guide line which is able to be inclined and displaced on the display screen of the image display portion.

12. The alignment method of a charged particle beam apparatus according to claim 8,
wherein in the operation setting step, the measurement reference points are set and input by directly plotting the operation of the operation input portion on the contour of the sample table image on the display screen of the image display portion on which the captured image including the sample table image is displayed.

13. The alignment method of a charged particle beam apparatus according to claim 12,
wherein if the measurement reference points which are already set and input are displayed and a pair of measurement reference points is set, remaining vertices of a right triangle or a rectangle in which a linear line connecting the pair of measurement reference points is set as a hypotenuse or the diagonal remaining vertices is displayed to be guided on the display screen of the image display portion on which the captured image including the sample table image is displayed.

14. An alignment program of a charged particle beam apparatus for causing a computer to execute: a sample table image display step of displaying a capture image acquired by an imaging device and including a sample table image of a sample table on which a sample is placed on an image display portion; an operation setting step of setting and inputting a measurement reference point by designating points that are positioned apart from each other on a contour of the sample table image based on an operation of an operation input portion on the captured image displayed on the image display portion by the sample table image display step; a sample table image size calculating step of calculating a size of the sample table image on the captured image based on a distance on the captured image between a plurality of measurement reference points which are set and input by the operation setting step; and an imaging magnification calculating step of calculating an imaging magnification of the captured image from a size of the sample table image calculated by the sample table image size calculating step and an actual size of the sample table; and a non-transitory computer-readable recording medium on which the alignment program is recorded.

* * * * *